United States Patent
Kim et al.

(10) Patent No.: US 11,828,952 B2
(45) Date of Patent: Nov. 28, 2023

(54) LIGHT SOURCE AND EXTREME ULTRAVIOLET LIGHT SOURCE SYSTEM USING THE SAME

(71) Applicant: Samsung Electronics Co., Ltd., Suwon-si (KR)

(72) Inventors: Dohyung Kim, Hwaseong-si (KR); Seongchul Hong, Suwon-si (KR); Kyungsik Kang, Bucheon-si (KR); Kyungbin Park, Seoul (KR); Motoshi Sakai, Suwon-si (KR); Seungkoo Lee, Seoul (KR); Jungchul Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 435 days.

(21) Appl. No.: 17/218,891

(22) Filed: Mar. 31, 2021

(65) Prior Publication Data
US 2022/0066225 A1    Mar. 3, 2022

(30) Foreign Application Priority Data
Aug. 27, 2020  (KR) .................. 10-2020-0108632

(51) Int. Cl.
| | |
|---|---|
| G02B 27/10 | (2006.01) |
| H05G 2/00 | (2006.01) |
| G02B 27/14 | (2006.01) |
| H01S 3/00 | (2006.01) |
| H01S 3/23 | (2006.01) |

(Continued)

(52) U.S. Cl.
CPC ....... *G02B 27/1073* (2013.01); *G02B 27/106* (2013.01); *G02B 27/108* (2013.01); *G02B 27/141* (2013.01); *G03F 7/70191* (2013.01); *H01S 3/0071* (2013.01); *H01S 3/2308* (2013.01); *H01S 3/2383* (2013.01); *H05G 2/008* (2013.01); *H01S 3/2232* (2013.01)

(58) Field of Classification Search
CPC  G02B 27/1073; G02B 27/106; G02B 27/108; G02B 27/141; G03F 7/70191; H01S 3/0071; H01S 3/2308; H01S 3/2383; H01S 3/2232; H05G 2/008
See application file for complete search history.

(56) References Cited

U.S. PATENT DOCUMENTS

| | | | |
|---|---|---|---|
| 8,872,144 B1 * | 10/2014 | Fomenkov | H05G 2/008 250/493.1 |
| 10,222,701 B2 | 3/2019 | Zhao et al. | |
| 10,222,702 B2 | 3/2019 | Bleeker et al. | |

(Continued)

*Primary Examiner* — Wyatt A Stoffa
*Assistant Examiner* — Mitchell T Oestreich
(74) *Attorney, Agent, or Firm* — Muir Patent Law, PLLC

(57) ABSTRACT

A light source capable of operating third and fourth reflection mirrors included in a beam splitting device in conjunction with movements of first and second reflection mirrors included in a beam transfer device and an optical assembly, respectively. The third and fourth reflection mirrors are disposed on optical paths of a pre-pulse and a main pulse emitted from first and second pulse generators, respectively. The light source operates the third and fourth reflection mirrors to offset an excessive compensation of the main pulse caused in a process of compensating for an optical path error of the pre-pulse. The light source may be included in an extreme ultraviolet light source system.

20 Claims, 6 Drawing Sheets

(51) Int. Cl.
*G03F 7/00* (2006.01)
*H01S 3/223* (2006.01)

(56) References Cited

U.S. PATENT DOCUMENTS

| | | |
|---|---|---|
| 10,420,198 B2 | 9/2019 | Hosoda et al. |
| 2006/0219957 A1 | 10/2006 | Ershov et al. |
| 2015/0261095 A1 | 9/2015 | Jansen et al. |
| 2015/0342016 A1 | 11/2015 | Rafac et al. |
| 2020/0037429 A1 | 1/2020 | Yabu |
| 2020/0068695 A1 | 2/2020 | Nagano et al. |
| 2020/0068697 A1 | 2/2020 | Fukuda |

* cited by examiner

LIGHT SOURCE AND EXTREME ULTRAVIOLET LIGHT SOURCE SYSTEM USING THE SAME

CROSS-REFERENCE TO RELATED APPLICATION(S)

This application claims benefit of priority to Korean Patent Application No. 10-2020-0108632 filed on Aug. 27, 2020 in the Korean Intellectual Property Office, the disclosure of which is incorporated herein by reference in its entirety.

BACKGROUND

The present inventive concept relates to a light source and an extreme ultraviolet light source system using the same.

Recently, for finely fabricating semiconductor devices, a lithography process using extreme ultraviolet light has been proposed. A minimal processing dimension of a circuit formed by a lithography process depends on a wavelength of a light source used in the lithography process. Therefore, in order to more finely fabricate semiconductor devices, it is necessary to shorten the wavelength of the light source used in the lithography process. Extreme ultraviolet light has a wavelength of about 1 to 100 nm. Since extreme ultraviolet light has a high absorption rate in all materials, it is difficult to use in a transmission-type optical system such as a lens, and it is commonly used in a reflection-type optical system. In order to generate extreme ultraviolet light from the light source, a laser produced plasma (LPP) scheme, based on laser irradiation of a dense medium, is commonly used.

SUMMARY

Example embodiments provide a light source capable of eliminating excessive compensation of a main pulse caused in a process of compensating for an error of a pre-pulse, and an extreme ultraviolet light source system using the same.

According to example embodiments, a light source includes: first and second pulse generators emitting a pre-pulse and a main pulse, respectively; a beam transfer device including a first reflection mirror reflecting the pre-pulse and the main pulse to adjust optical paths of the pre-pulse and the main pulse and guiding the pre-pulse and the main pulse into an exposure chamber; an optical assembly disposed inside the exposure chamber, condensing the pre-pulse and the main pulse provided from the beam transfer device at respective focal positions, and including a second reflection mirror reflecting the pre-pulse and the main pulse to change the optical paths of the pre-pulse and the main pulse; a beam splitting device receiving the pre-pulse and the main pulse from the optical assembly, the beam splitting device including first and second beam splitters transmitting the pre-pulse and reflecting the main pulse, and third and fourth reflection mirrors reflecting the main pulse reflected by the first beam splitter to the second beam splitter to delay the phase of the main pulse as compared with the phase of the pre-pulse, the third and fourth reflection mirrors being operated in conjunction with the first and second reflection mirrors, respectively; a beam detector configured to receive the pre-pulse and the main pulse from the beam splitting device and to detect the optical paths of the pre-pulse and the main pulse; and a controller calculating an optical path error value of the pre-pulse based on the optical path of the pre-pulse detected by the beam detector, controlling the first and second reflection mirrors based on the optical path error value of the pre-pulse to compensate for an optical path error of the pre-pulse, and controlling the third and fourth reflection mirrors to be operated in conjunction with the first and second reflection mirrors to additionally compensate for an optical path error of the main pulse.

According to example embodiments, a light source includes: first and second pulse generators emitting a first laser pulse and a second laser pulse, respectively; first and second reflection mirrors disposed on first and second optical paths of the first and second laser pulses to adjust the first and second optical paths of the first and second laser pulses; a beam splitting device receiving the first and second laser pulses from the first and second reflection mirrors, the beam splitting device including first and second beam splitters transmitting the first laser pulse and reflecting the second laser pulse, and third and fourth reflection mirrors reflecting the second laser pulse reflected by the first beam splitter to the second beam splitter to delay the phase of the second laser pulse as compared with the phase of the first laser pulse, the third and fourth reflection mirrors being operated in conjunction with the first and second reflection mirrors, respectively; a beam detector configured to receive the first laser pulse and the second laser pulse from the beam splitting device and to detect the first and second optical paths of the first and second laser pulses; and a controller calculating a first optical path error value of the first laser pulse based on the first optical path detected by the beam detector, controlling the first and second reflection mirrors based on the first optical path error value to compensate for the first optical path error value, and controlling the third and fourth reflection mirrors to be operated in conjunction with the first and second reflection mirrors, respectively, to additionally compensate for a second optical path error value of the second laser pulse.

According to example embodiments, an extreme ultraviolet light source system includes: a light source chamber; a droplet supply unit disposed on one side of the light source chamber to discharge a droplet; and a light source sequentially irradiating the droplet with first and second laser pulses, wherein the light source includes: first and second pulse generators emitting the first and second laser pulses, respectively; first and second reflection mirrors disposed on first and second optical paths of the first and second laser pulses to adjust the first and second optical paths of the first and second laser pulses; a beam splitting device receiving the first and second laser pulses from the first and second reflection mirrors, the beam splitting device including first and second beam splitters transmitting the first laser pulse and reflecting the second laser pulse, and third and fourth reflection mirrors reflecting the second laser pulse reflected by the first beam splitter to the second beam splitter to delay the phase of the second laser pulse as compared with the phase of the first laser pulse, the third and fourth reflection mirrors being operated in conjunction with the first and second reflection mirrors, respectively; a beam detector configured to receive the first laser pulse and the second laser pulse from the beam splitting device and to detect the first and second optical paths of the first and second laser pulses; and a controller calculating a first optical path error value of the first laser pulse based on the first optical path detected by the beam detector, controlling the first and second reflection mirrors based on the first optical path error value to compensate for the first optical path error value, and controlling the third and fourth reflection mirrors to be operated in conjunction with the first and second reflection mirrors to additionally compensate for a second optical path error value of the second laser pulse.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments will be described with reference to the accompanying drawings.

Figure 1:
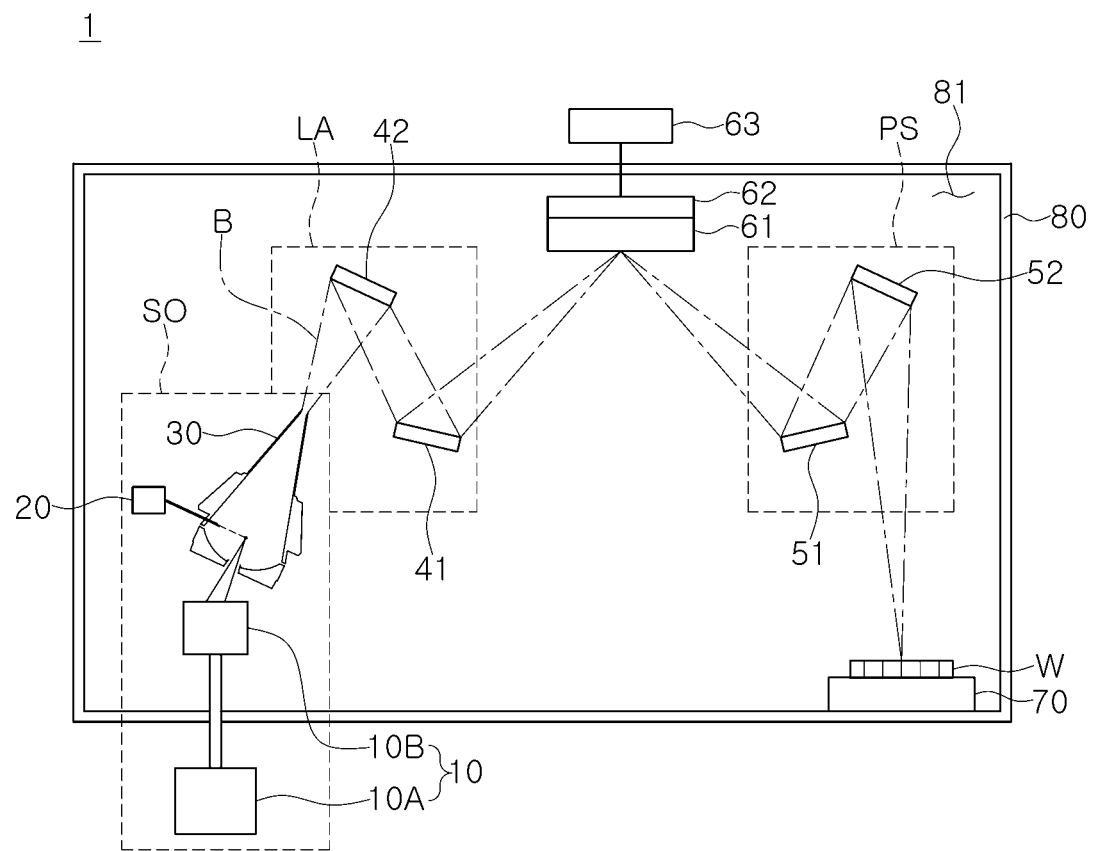
FIG. 1 is a diagram schematically illustrating extreme ultraviolet exposure equipment employing an extreme ultraviolet light source system according to an example embodiment of the present disclosure.
Figure 2:
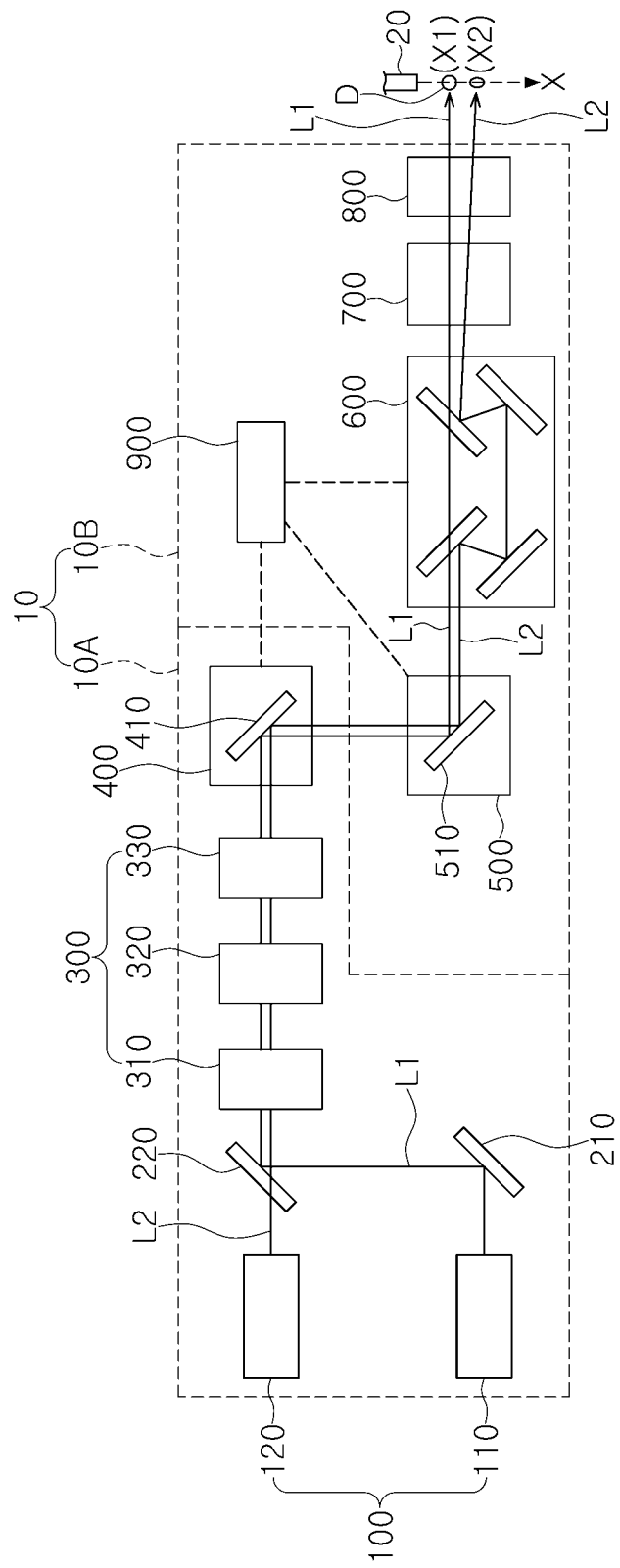
FIG. 2 is a block diagram of a light source employed in the extreme ultraviolet light source system of FIG. 1.

FIG. 1 is a diagram schematically illustrating extreme ultraviolet exposure equipment employing an extreme ultraviolet light source system according to an example embodiment of the present disclosure, and FIG. 2 is a block diagram schematically illustrating the extreme ultraviolet light source system of FIG. 1.

Referring to FIG. 1, extreme ultraviolet exposure equipment 1 according to an example embodiment of the present disclosure may include an exposure chamber 80, an extreme ultraviolet light source system SO, a lithographic apparatus LA, a projection system PS, an upper electrostatic chuck (ESC) 62, and a lower ESC 70.

The exposure chamber 80 may have an inner space 81, and the extreme ultraviolet light source system SO, the lithographic apparatus LA, the projection system PS, the upper ESC 62, and the lower ESC 70 may be disposed in the inner space 81. However, some components may be disposed outside the exposure chamber 80. For example, the extreme ultraviolet light source system SO may be partially disposed outside the exposure chamber 80. A mask 61 may be loaded onto or unloaded from the upper ESC 62 by an electrostatic force formed by power applied from a power supply unit 63, and a substrate W such as a semiconductor wafer may be loaded onto or unloaded from the lower ESC 70. The inner space 81 of the exposure chamber 80 may be in a low-pressure state of 5 Pa or less or in a vacuum state to prevent extreme ultraviolet light B generated by the extreme ultraviolet light source system SO from being absorbed into a gas.

The extreme ultraviolet light source system SO may include a light source chamber 30, a light source 10, and a droplet supply unit 20. The extreme ultraviolet light source system SO may generate extreme ultraviolet light B having a wavelength of less than about 100 nm. The extreme ultraviolet light source system SO may be, for example, a plasma source. In addition, the extreme ultraviolet light source system SO may be a laser-produced plasma (LPP) light source that uses a laser as an excitation light source, targeting a droplet D formed of any one of tin (Sn), lithium (Li), and xenon (Xe). The light source 10 may be an excitation light source supplying a laser to the extreme ultraviolet light source system SO. A first part 10A, which is a part of the light source 10, may be installed outside the exposure chamber 80, and a second part 10B, which is the other part of the light source 10, may be installed inside the exposure chamber 80. The light source 10 may be a master oscillator power amplifier (MOPA) type laser system. The extreme ultraviolet light source system SO may emit extreme ultraviolet light using plasma that is caused by generating a pre-pulse and a main pulse using a seed laser, irradiating the droplet D with the pre-pulse, and then irradiating the droplet D again with the main pulse.

In the light source chamber 30 of the extreme ultraviolet light source system SO, droplets D supplied by the droplet supply unit 20 may collide with the laser supplied by the light source 10 at a rate of 50000 or more times per second to generate the plasma. A collector in the light source chamber 30 may collect the extreme ultraviolet light B emitted from the plasma in all directions and concentrate the extreme ultraviolet light B to be directed toward the lithographic apparatus LA.

The lithographic apparatus LA may include a plurality of mirrors to irradiate the upper ESC 62 with the extreme ultraviolet light B emitted from the extreme ultraviolet light source system SO. Since the plurality of mirrors included in the lithographic apparatus LA have an already known structure, only two mirrors 41 and 42 are illustrated for simplicity of the drawings and for convenience of description.

The projection system PS may include a plurality of mirrors to irradiate the substrate W disposed on the lower ESC 70 with the extreme ultraviolet light B having a pattern, which is reflected from the mask 61 attached to the upper ESC 62, such that the pattern is exposed to a surface of the substrate W. Since the plurality of mirrors included in the projection system PS have an already known structure, only two mirrors 51 and 52 are illustrated for simplicity of the drawings and for convenience of description.

Hereinafter, the light source 10 will be described.

Referring to FIG. 1, the light source 10 according to the example embodiment may include the first part 10A installed outside the exposure chamber 80 and the second part 10B installed inside the exposure chamber 80, as described above. In addition, the light source 10 may include a plurality of mirrors 210 and 220.

Referring to FIG. 2, the first part 10A of the light source 10 may include a pulse generator 100, a power amplifier 300, and a beam transfer device 400. The second part 10B of the light source 10 may include an optical assembly 500, a beam splitting device 600, a beam measurement device 700, and a focusing unit 800. Each component constituting the first and second parts 10A and 10B may be controlled through a controller 900.

The controller 900, which is provided for controlling the overall operation of the light source 10, may be implemented as a processor, e.g. a central processing unit (CPU), a graphic processing unit (GPU), a microprocessor, an application specific integrated circuit (ASIC), or a field programmable gate array (FPGA), and may include a memory for storing various types of data required for operating the light source 10.

The pulse generator 100, which is a seed laser, may include a first pulse generator 110 and a second pulse generator 120. The first and second pulse generators 110 and 120 may provide first and second laser pulses L1 and L2, respectively, at the same time period (e.g., simultaneously). The time period of the first and second laser pulses L1 and L2 may be greater than a delay time of the second laser pulse, which will be described later.

The first pulse generator 110 may provide the first laser pulse L1. For example, the first pulse generator 110 may have a frequency of 50 kHz or more, and may be a $CO_2$ laser generator that oscillates a laser pulse having a wavelength of 9.3 μm or 10.6 μm. The first laser pulse L1 is known as a pre-pulse. The first laser pulse L1 may increase a surface area of the droplet D in advance before the second laser pulse L2 is absorbed into and interacted with the droplet D, thereby increasing conversion efficiency. The conversion efficiency refers to a ratio of an output power of extreme ultraviolet light to an input power of $CO_2$ laser.

The first laser pulse L1 may irradiate position X1 of the light source chamber 30, toward the droplet D traveling in direction X, to increase the surface area of the droplet D. Since the droplet D has a smaller diameter than the first laser pulse L1, the first laser pulse L1, which is a laser pulse having a relatively low output, may collide with and irradiate the droplet D to expand the surface area of the droplet D. Subsequently, as a result of the expanded surface area of the spherical droplet D, the second laser pulse L2 may more accurately collide with and irradiate the droplet D.

The second pulse generator 120 may provide the second laser pulse L2. For example, the second pulse generator 120 may have a frequency of 50 kHz or more, and may be a $CO_2$ laser that oscillates a laser pulse having a wavelength of 9.3 μm or 10.6 μm or an Nd:YAG laser that oscillates a laser pulse having a wavelength of 0.5 μm or 1 μm. The second laser pulse L2 is also known as the main pulse. The second laser pulse L2 may irradiate position X2, and may be absorbed into the expanded surface area of the droplet D, at the position X2 to form plasma emitting extreme ultraviolet light.

The first and second laser pulses L1 and L2 provided by the first pulse generator 110 and the second pulse generator 120, respectively, may be adjusted to have the same optical path, while passing through the plurality of mirrors 210 and 220.

The power amplifier 300 may amplify the first and second laser pulses L1 and L2, and may include a plurality of power amplifiers. In FIG. 2, it is illustrated that the power amplifier 300 includes three power amplifiers 310, 320, and 330 arranged in series, but the number of power amplifiers is not limited thereto, and may increase or decrease according to example embodiments.

The pulse generator 100 and the power amplifier 300 may be disposed outside the exposure chamber 80, and the first and second laser pulses L1 and L2 amplified by the power amplifier 300 may be transferred into the exposure chamber 80 through the beam transfer device 400. The beam transfer device 400 may include an assembly board, a periscope, and a plurality of mirrors. In FIG. 2, only a first reflection mirror 410, which is an adjustable mirror, is illustrated for convenience of description. The first reflection mirror 410 may adjust a reflection angle to regulate an incident position or an incident angle of the transferred first and second laser pulses L1 and L2. In the example embodiment, the first reflection mirror 410 located in front of a second reflection mirror 510 along the optical path of the first and second laser pulses L1 and L2, which will be described later, may be used to regulate the incident position of the first and second laser pulses L1 and L2.

The first and second laser pulses L1 and L2 transferred through the beam transfer device 400 may be condensed, by the optical assembly 500, at respective focal positions at which the first and second laser pulses L1 and L2 provided from the beam transfer device 400 meet the droplet D. The optical assembly 500 may include a plurality of mirrors. In FIG. 2, only the second reflection mirror 510, which is an adjustable mirror, is illustrated for convenience of description. The second reflection mirror 510 may adjust a reflection angle to regulate an incident position or an incident angle of the first and second laser pulses L1 and L2. In the example embodiment, the second reflection mirror 510 located after the first reflection mirror 410 along the optical path of the first and second laser pulses L1 and L2, may be used to regulate the incident angle of the first and second laser pulses L1 and L2. In this way, the incident position or the incident angle may be regulated by the first reflection mirror 410 of the beam transfer device 400 and the second reflection mirror 510 of the optical assembly 500. Since the second reflection mirror 510 is disposed closer, in reference to the optical path of the first and second laser pulses L1 and L2, to the droplet D than the first reflection mirror 410, the second reflection mirror 510 may be used to regulate the incident angle which requires more precision in regulation than the incident position.

The beam splitting device 600 may split and adjust the optical path of the first and second laser pulses L1 and L2 provided through the optical assembly 500, such that a focal position irradiated with the second laser pulse L2 is different from that irradiated with the first laser pulse L1, and a phase of the second laser pulse L2 is delayed as compared with that of the first laser pulse L1. For example, the second laser pulse L2 may have a later phase than the first laser pulse L1 by a delay time. Accordingly, the droplet D may be irradiated with the second laser pulse L2 at the position X2 after being irradiated with the first laser pulse L1 at the position X1.

Figure 3:
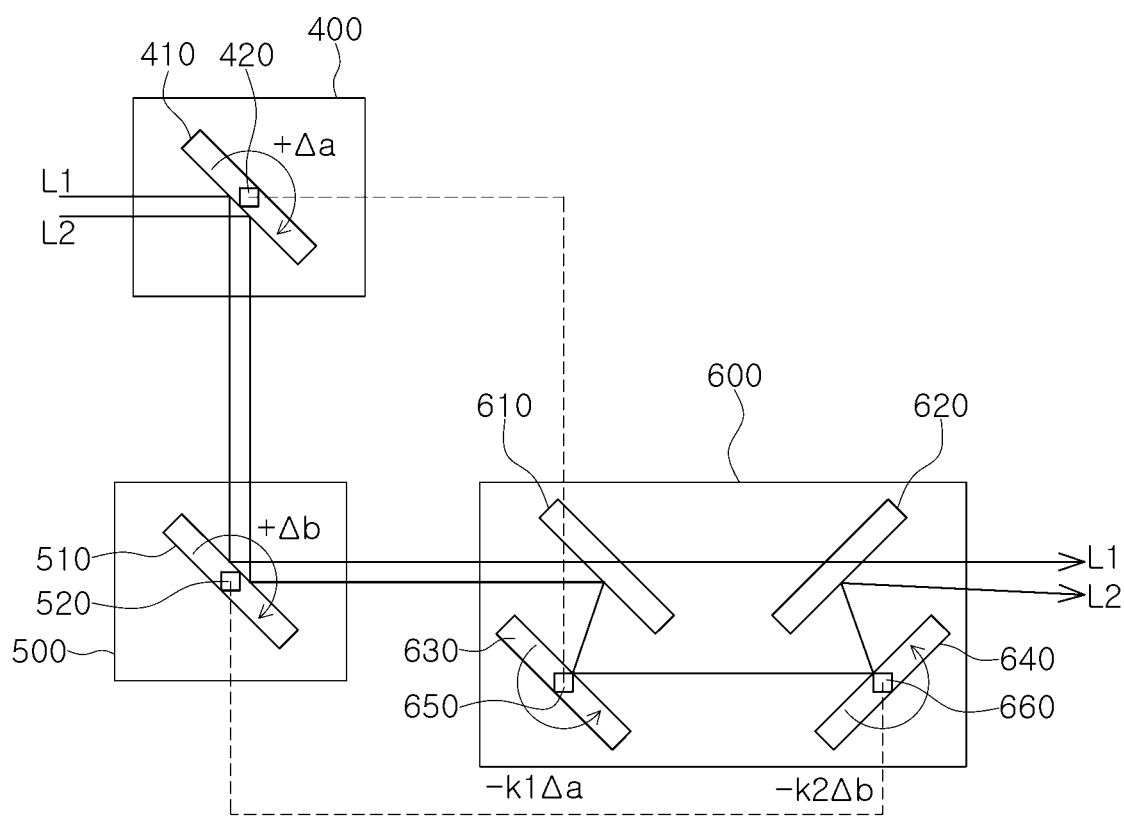
FIG. 3 is a diagram illustrating optical paths of first and second laser pulses transmitted through a beam splitting device of the light source of FIG. 2.

Referring to FIG. 3, the beam splitting device 600 may include first and second beam splitters 610 and 620 and third and fourth reflection mirrors 630 and 640. The beam splitting device 600 may include a plurality of fixed mirrors in addition to the third and fourth reflection mirrors 630 and 640. However, since the plurality of mirrors have an already known structure, a description thereof will be omitted.

The first and second beam splitters 610 and 620 may be disposed to transmit the first laser pulse L1, while reflecting the second laser pulse L2. The first and second beam splitters 610 and 620 may have a fixed position in which a reflection angle cannot adjusted. Each of the first and second beam splitters 610 and 620 may include, for example, a dichroic mirror.

The third and fourth reflection mirrors 630 and 640 may be disposed on the optical path of the second laser pulse L2 to reflect the second laser pulse L2 split by the first beam splitter 610 to the second beam splitter 620.

The third reflection mirror 630 may be disposed to reflect the second laser pulse L2 reflected by the first beam splitter 610 to the fourth reflection mirror 640, and the fourth reflection mirror 640 may be disposed to reflect the second laser pulse L2 to the second beam splitter 620.

The third and fourth reflection mirrors 630 and 640 may reflect the second laser pulse L2 in a direction toward the second beam splitter 620, while adjusting the optical path of the second laser pulse L2 to be disposed behind the optical path of the first laser pulse L1 on the basis of the traveling direction of the droplet D. For example, as discussed above with reference to FIG. 2, the first laser pulse L1 will irradiate the droplet D at position X1 and the second laser pulse L2 will subsequently irradiate the droplet D at position X2.

Separate driving units 650 and 660 may be disposed in the third and fourth reflection mirrors 630 and 640, respectively. The third and fourth reflection mirrors 630 and 640 may be tilted or shifted according to the control of the controller 900 to adjust the optical path of the second laser pulse L2. As the driving units 650 and 660, driving devices capable of quickly responding to a small displacement may be employed. For example, the driving units 650 and 660 may each include a piezo motor such that the third and fourth reflection mirrors 630 and 640 are tilted or shifted very quickly according to the control of the controller 900.

While passing through the beam splitting device 600, the first laser pulse L1 and the second laser pulse L2 may have different optical paths both temporally and spatially. In order to maintain the conversion efficiency of the light source 10, it is necessary to keep the optical paths of the first laser pulse L1 and the second laser pulse L2 constant at all times.

The LPP-type light source may accurately irradiate the droplet D moving at a high speed with the first and second laser pulses L1 and L2 to form extreme ultraviolet light. Therefore, in order to stably maintain the output of the generated near-infrared light, the optical paths of the first and second laser pulses L1 and L2 need to be kept constant at all times. However, as the light source 10 becomes increasingly high-powered, the optical paths of the first and second laser pulses L1 and L2 may be distorted by heat generated from the power amplifier 300. In order to solve this problem, the adjustable mirrors may be disposed in the beam transfer device 400 and the optical assembly 500, respectively, to correct the optical paths of the first and second laser pulses L1 and L2. The correction of the optical paths is performed based on the first laser pulse L1, which first irradiates the droplet D. In this process, the optical path of the second laser pulse L2 may be excessively corrected.

The controller 900 according to the example embodiment may control the third and fourth reflection mirrors 630 and 640 to be moved to offset an excessive correction caused by the first and second reflection mirrors 410 and 510, while being operated in conjunction with movements of the first and second reflection mirrors 410 and 510, thereby reversely correcting the excessive correction caused by the first and second reflection mirrors 410 and 510. The third reflection mirror 630 may be operated in conjunction with the first reflection mirror 410 and the fourth reflection mirror 640 may be operated in conjunction with the second reflection mirror 510. Alternatively, the third mirror 630 may be operated in conjunction with the second reflection mirror 510 and the fourth reflection mirror 640 may be operated in conjunction with the first reflection mirror 410.

Referring to FIGS. 2 and 3, an example in which the third and fourth reflection mirrors 630 and 640 are operated in conjunction with the first and second reflection mirrors 410 and 510, respectively, will be described.

When the first reflection mirror 410 is tilted clockwise by Δa and the second reflection mirror 510 is tilted clockwise by Δb, the controller 900 may drive the driving units 650 and 660 to tilt the third reflection mirror 630 counterclockwise by k1Δa and tilt the fourth reflection mirror 640 counterclockwise by k2Δb to reversely correct the excessive correction caused by the first and second reflection mirrors 410 and 510. Here, k1 and k2 are parameters, and may be determined in consideration of a difference in optical path length between the first and second laser pulses L1 and L2. In the example embodiment, k1 may be 0.7 and k2 may be 0.3.

That is, the third reflection mirror 630 may be moved in conjunction with the movement of the first reflection mirror 410 but, to provide a reverse correction to the movement of the first reflection mirror 410, the third reflection mirror 630 may be moved in the reverse direction by k1 multiplied by the movement of the first reflection mirror 410. In addition, the fourth reflection mirror 640 may be moved in conjunction with the movement of the second reflection mirror 520 but, to provide a reverse correction to the movement of the second reflection mirror 520, the fourth reflection mirror 640 may be moved in the reverse direction by k2 multiplied by the movement of the second reflection mirror 520. The third and fourth reflection mirrors 630 and 640 may be operated in conjunction with the movements of the first and second reflection mirrors 410 and 510 and moved simultaneously with the movements of the first and second reflection mirrors 410 and 510, respectively. However, the movements of the third and fourth reflection mirrors 630 and 640 are not limited thereto, and the third and fourth reflection mirrors 630 and 640 may be moved with a predetermined time difference from the first and second reflection mirrors 410 and 510 according to example embodiments.

The effect caused by adjusting the third and fourth reflection mirrors 630 and 640 as described above will be described with reference to FIGS. 4A to 4D. FIGS. 4A to 4D illustrate first and second laser pulses PP and MP measured through the beam measurement device 700 of FIG. 2. As further illustrated in FIGS. 4A to 4D, the beam measurement device 700 may act as a beam detector to detect the position of the optical paths of the first and second laser pulses PP and MP with respect to a reference position or value.

Figure 4A:
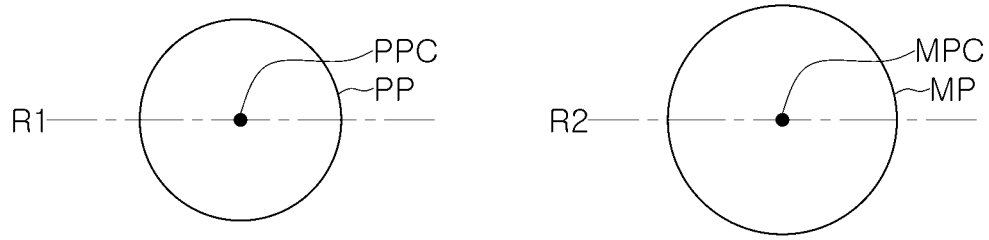
FIGS. 4A to 4D are diagrams illustrating a second laser pulse compensating effect of the light source according to the example embodiment of the present disclosure.

FIG. 4A illustrates an ideal state in which the centers PPC and MPC of the first and second laser pulses PP and MP are accurately matched to respective reference values R1 and R2 thereof.

Figure 4B:
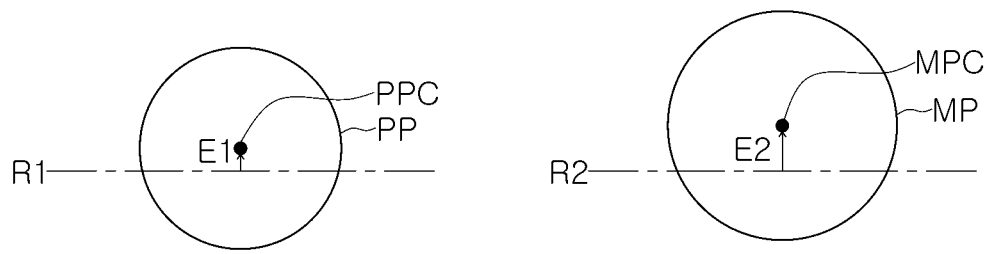

FIG. 4B illustrates that optical paths of the first and second laser pulses PP and MP are distorted. It can be seen therefrom that the center PPC of the first laser pulse PP is shifted above the first reference value R1 by a first error value E1, and the center MPC of the second laser pulse MP is also shifted above the second reference value R2 by a second error value E2. The error tends to increase gradually as the optical path increases. Since the optical path of the second laser pulse MP is longer than the optical path of the first laser pulse PP, the second error value E2 is generally a greater value than the first error value E1. The position of the center PPC of the first laser pulse PP and the position of the center MPC of the second laser pulse MP may be detected by the beam measurement device 700 and transmitted to the controller 900. The controller 900 may calculate the first error value E1 based on the received detected position of the center PPC of the first laser pulse PP and the first reference value R1. Based on the calculated first error value E1, the controller 900 may control the positions of the first and second reflection mirrors 410 and 510 to correct the optical paths of the first and second laser pulses PP and MP.

Figure 4C:
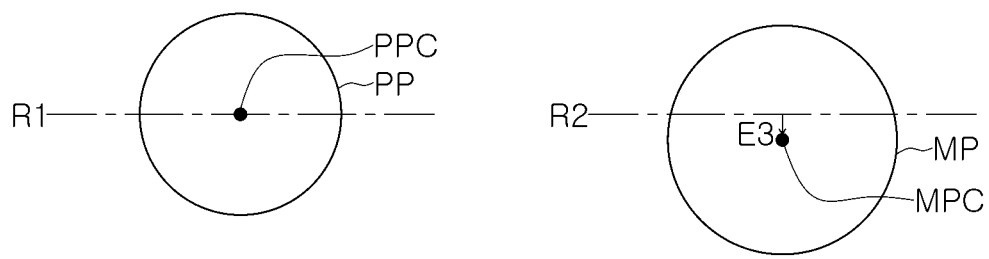

FIG. 4C illustrates that when the first and second reflection mirrors 410 and 510 of FIG. 2 are tilted to correct the optical paths of the first and second laser pulses PP and MP based on the first laser pulse PP (e.g., the first error value E1), the second laser pulse MP is excessively corrected by a third error value E3. It can be seen therefrom that the center PPC of the first laser pulse PP is matched to the first reference value R1, but the second laser pulse MP is excessively corrected and the center MPC of the second laser pulse MP is shifted below the second reference value R2 by the third error value E3. Referring to FIG. 3, this excessive correction may occur in a process in which the second laser pulse MP is reflected by the third and fourth reflection mirrors 630 and 640 of the beam splitting device 600.

In the example embodiment, the positions of the third and fourth reflection mirrors 630 and 640 may be adjusted to prevent the second laser pulse MP from being excessively corrected by the first and second reflection mirrors 410 and 510. For example, subsequent to the controller 900 controlling the positions the first and second reflection mirrors 410 and 510 to correct the optical paths of the first and second laser pulses PP and MP based on the calculated error value E1, the beam measurement device 700 may detect and transmit the position of the center MPC of the second laser pulse MP to the controller 900. The controller 900 may calculate the third error value E3 based on the received detected position of the center MPC of the second laser pulse MP and the second reference value R2. Based on the calculated third error value E3, the controller 900 may control the positions of the third and fourth reflection mirrors 630 and 640 to correct the optical path of the second laser pulse MP. The controller 900 may control the positions of the third and fourth reflection mirrors 630 and 640 to correct the optical path of the second laser pulse MP in conjunction with the first and second reflection mirrors 410 and 510. For example, the controller 900 may offset the excessive correction of the second laser pulse MP by reversely correcting the third and fourth reflection mirrors 630 and 640 by a parameter multiplied by the respective correction values of the first and second reflection mirrors 410 and 510.

Figure 4D:
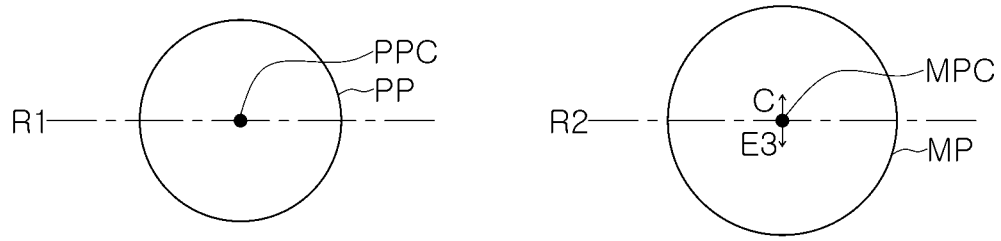

In FIG. 4D, it can be seen that the center MPC of the second laser pulse MP is accurately matched to the second reference value R2 by reversely correcting C the third and fourth reflection mirrors 630 and 640 so that the third error value E3 caused by the excessive correction can be offset by the third and fourth reflective mirrors 630 and 640.

Figure 5:
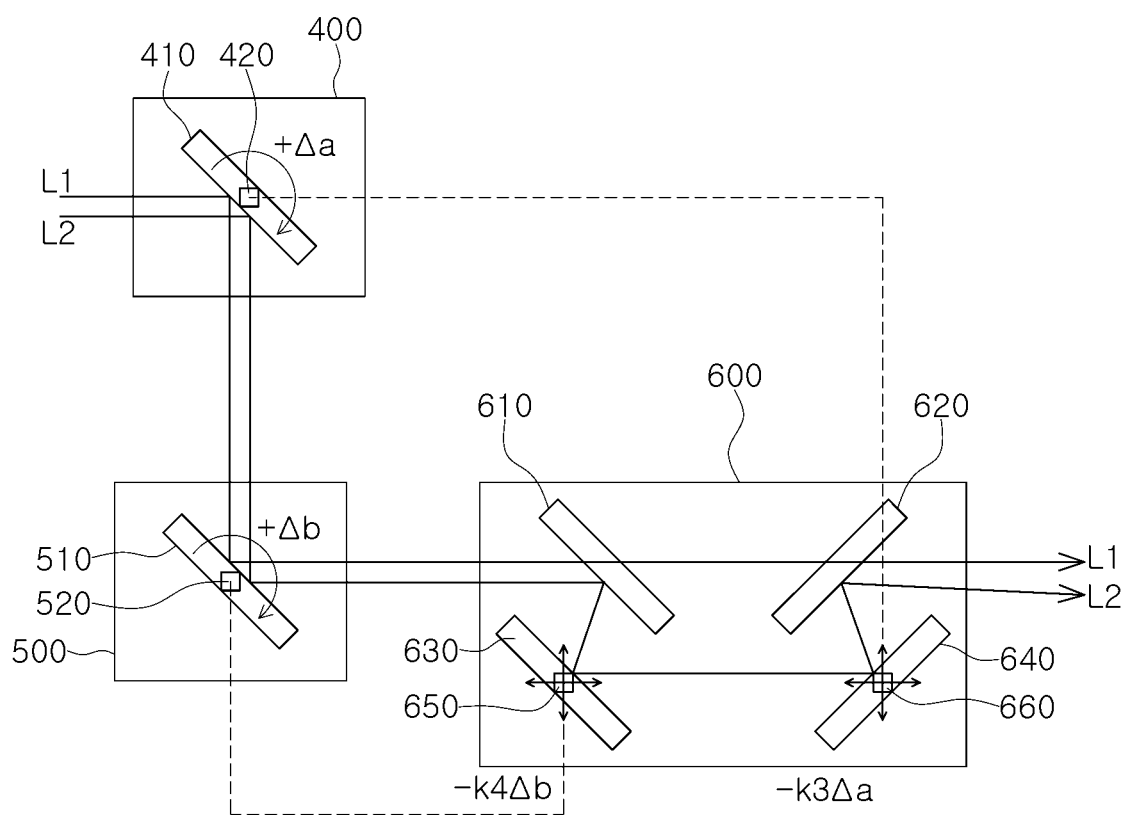
FIGS. 5 and 6 are diagrams illustrating modified examples of the light source according to the example embodiment of the present disclosure.
Figure 6:
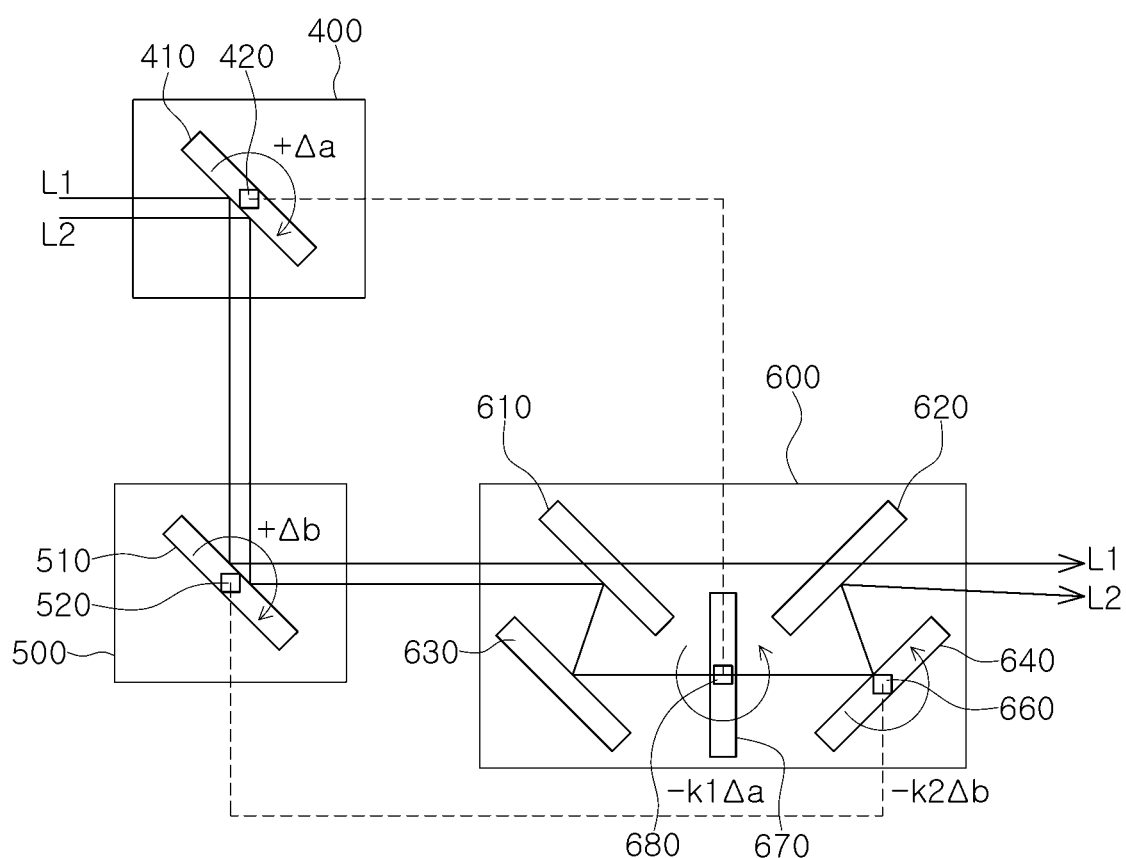

Referring to FIGS. 5 and 6, other example embodiments in which the third and fourth reflection mirrors 630 and 640 are operated in conjunction with the first and second reflection mirrors 410 and 510, respectively, will be described.

FIG. 5 illustrates that the fourth and third reflection mirrors 640 and 630 are shifted according to angles at which the first and second reflecting mirrors 410 and 510 are tilted, respectively. For example, the first reflection mirror 410 and the fourth reflection mirror 640 may be operated in conjunction with each other, and the second reflection mirror 510 and the third reflection mirror 630 may be operated in conjunction with each other. In this case, an excessive correction caused by tilting the first and second reflection mirrors 410 and 510 may be reversely corrected by shifting and moving the fourth and third reflection mirrors 640 and 630, respectively.

When the first reflection mirror 410 is tilted clockwise by Δa and the second reflection mirror 510 is tilted clockwise by Ab, the controller 900 may drive the driving units 650 and 660 to shift the fourth reflection mirror 640 downwardly by k3Δa and shift the third reflection mirror 630 downwardly by k4Δb to reversely correct the excessive correction caused by the first and second reflection mirrors 410 and 510. Here, k3 and k4 may be a value of k1×k5 and a value of k2×k5, respectively. Wherein k5 is a parameter for converting a tilt value (°) into a shift value (mm). In the example embodiment, k5 may be 4.

FIG. 6 illustrates that an optical element 670 is added between the third and fourth reflection mirrors 630 and 640 to change the optical path of the second laser pulse L2. In the example embodiment of FIG. 6, the correction is performed by the optical element 670 instead of the third reflection mirror 630. As the optical element 670, a plate capable of shifting the phase of the second laser pulse L2 according to a degree to which the plate is tilted by the driver 680 may be employed.

As set forth above, according to the example embodiment in the present disclosure, it is possible to provide a light source capable of eliminating an excessive compensation of the main pulse (i.e., the second laser pulse L2) caused in a process of compensating for an error of the pre-pulse (i.e., the first laser pulse L1) to keep relative positions of the pre-pulse and the main pulse constant, and an extreme ultraviolet light source system using the same.

While example embodiments have been shown and described above, it will be apparent to those skilled in the art that modifications and variations could be made without departing from the scope of the present invention as defined by the appended claims.

What is claimed is:

1. A light source comprising:
   first and second pulse generators emitting a pre-pulse and a main pulse, respectively;
   a beam transfer device including a first reflection mirror reflecting the pre-pulse and the main pulse to adjust optical paths of the pre-pulse and the main pulse and guiding the pre-pulse and the main pulse into an exposure chamber;
   an optical assembly disposed inside the exposure chamber, condensing the pre-pulse and the main pulse provided from the beam transfer device at respective focal positions, and including a second reflection mirror reflecting the pre-pulse and the main pulse to change the optical paths of the pre-pulse and the main pulse;
   a beam splitting device receiving the pre-pulse and the main pulse from the optical assembly, the beam splitting device including
   first and second beam splitters transmitting the pre-pulse and reflecting the main pulse, and
   third and fourth reflection mirrors reflecting the main pulse reflected by the first beam splitter to the second beam splitter to delay the phase of the main pulse as compared with the phase of the pre-pulse, the third and fourth reflection mirrors being operated in conjunction with the first and second reflection mirrors, respectively;
   a beam detector configured to receive the pre-pulse and the main pulse from the beam splitting device and to detect the optical paths of the pre-pulse and the main pulse; and
   a controller calculating an optical path error value of the pre-pulse based on the optical path of the pre-pulse detected by the beam detector, controlling the first and second reflection mirrors based on the optical path error value of the pre-pulse to compensate for an optical path error of the pre-pulse, and controlling the third and fourth reflection mirrors to be operated in conjunction with the first and second reflection mirrors to additionally compensate for an optical path error of the main pulse.

2. The light source of claim 1, wherein the third and fourth reflection mirrors are operated in conjunction with rotations of the first and second reflection mirrors and each of the third and fourth reflection mirrors are rotated or shifted in a reverse direction by one of a first parameter and a second parameter multiplied by the rotations of one of the first and second reflection mirrors.

3. The light source of claim 2, wherein the third reflection mirrors is rotated to correspond to the rotation of the first reflection mirror multiplied by the first parameter, the fourth reflection mirror is rotated to correspond to the rotation the second reflection mirror multiplied by the second parameter, and the first parameter is 0.7 and the second parameter is 0.3.

4. The light source of claim 2, wherein the third reflection mirror is rotated to correspond to the rotation of the second reflection mirror multiplied by the first parameter,
the fourth reflection mirror is rotated to correspond to the rotation the first reflection mirror multiplied by the second parameter, and
the first parameter is 0.7 and the second parameter is 0.3.

5. The light source of claim 2, wherein the third reflection mirror is shifted to correspond to the rotation of the first reflection mirror multiplied by the first parameter,
the fourth reflection mirror is shifted to correspond to the rotation the second reflection mirror multiplied by the second parameter, and
the first parameter is 0.7 k, the second parameter is 0.3 k, and k is 0.4.

6. The light source of claim 1, wherein the third reflection mirror reflects the main pulse reflected by the first beam splitter, and
the fourth reflection mirror reflects the main pulse reflected by the third reflection mirror to the second beam splitter.

7. The light source of claim 1, wherein each of the first and second beam splitters includes a dichroic mirror.

8. The light source of claim 1, further comprising a power amplifier disposed between the first and second pulse generators and the beam transfer device.

9. The light source of claim 8, wherein the power amplifier includes a plurality of power amplifiers, and
the plurality of power amplifiers are connected to each other in series.

10. The light source of claim 1, wherein the first and second pulse generators and the beam transfer device are disposed outside the exposure chamber.

11. The light source of claim 1, wherein the pre-pulse and the main pulse are emitted from the first and second pulse generators, respectively, at a same first time period.

12. The light source of claim 11, wherein the first time period is greater than a delay time of the main pulse.

13. The light source of claim 1, wherein the third and fourth reflection mirrors are driven by driving units, and each of the driving units includes a piezo motor.

14. A light source comprising:
first and second pulse generators emitting a first laser pulse and a second laser pulse, respectively;
first and second reflection mirrors disposed on first and second optical paths of the first and second laser pulses to adjust the first and second optical paths of the first and second laser pulses;
a beam splitting device receiving the first and second laser pulses from the first and second reflection mirrors, the beam splitting device including
first and second beam splitters transmitting the first laser pulse and reflecting the second laser pulse, and
third and fourth reflection mirrors reflecting the second laser pulse reflected by the first beam splitter to the second beam splitter to delay the phase of the second laser pulse as compared with the phase the first laser pulse, the third and fourth reflection mirrors being operated in conjunction with the first and second reflection mirrors, respectively;
a beam detector configured to receive the first laser pulse and the second laser pulse from the beam splitting device and to detect the first and second optical paths of the first and second laser pulses; and
a controller calculating a first optical path error value of the first laser pulse based on the first optical path detected by the beam detector, controlling the first and second reflection mirrors based on the first optical path error value to compensate for the first optical path error value, and controlling the third and fourth reflection mirrors to be operated in conjunction with the first and second reflection mirrors, respectively, to additionally compensate for a second optical path error value of the second laser pulse.

15. The light source of claim 14, wherein the third and fourth reflection mirrors are operated in conjunction with rotations of the first and second reflection mirrors and each of the third and fourth reflection mirrors are rotated or shifted in a reverse direction by one of a first parameter and a second parameter multiplied by the rotations of one of the first and second reflection mirrors.

16. The light source of claim 14, wherein the first and second pulse generators and the first reflection mirror are disposed outside an exposure chamber of an extreme ultraviolet light source system.

17. The light source of claim 16, further comprising a power amplifier disposed between the first and second pulse generators and the first reflection mirror,
wherein the power amplifier is disposed outside the exposure chamber.

18. An extreme ultraviolet light source system comprising:
a light source chamber;
a droplet supply unit disposed on one side of the light source chamber to discharge a droplet; and
a light source sequentially irradiating the droplet with first and second laser pulses,
wherein the light source includes:
first and second pulse generators emitting the first and second laser pulses, respectively;
first and second reflection mirrors disposed on first and second optical paths of the first and second laser pulses to adjust the first and second optical paths of the first and second laser pulses;
a beam splitting device receiving the first and second laser pulses from the first and second reflection mirrors, the beam splitting device including
first and second beam splitters transmitting the first laser pulse and reflecting the second laser pulse, and
third and fourth reflection mirrors reflecting the second laser pulse reflected by the first beam splitter to the second beam splitter to delay the phase of the second laser pulse as compared with the phase of the first laser pulse, the third and fourth reflection mirrors being operated in conjunction with the first and second reflection mirrors, respectively;
a beam detector configured to receive the first laser pulse and the second laser pulse from the beam splitting device and to detect the first and second optical paths of the first and second laser pulses; and
a controller calculating a first optical path error value of the first laser pulse based on the first optical path detected by the beam detector, controlling the first and second reflection mirrors based on the first optical path error value to compensate for the first optical path error value, and controlling the third and fourth reflection mirrors to be operated in conjunction with the first and second reflection mirrors, respectively, to additionally compensate for a second optical path error value of the second laser pulse.

19. The extreme ultraviolet light source system of claim 18, wherein the droplet contains any one of tin (Sn), lithium (Li), and xenon (Xe).

20. The extreme ultraviolet light source system of claim 18, wherein the third and fourth reflection mirrors are operated in conjunction with rotations of the first and second reflection mirrors and each of the third and fourth reflection mirrors are rotated or shifted in a reverse direction by one of first parameter and a second parameter multiplied by the rotations of one of the first and second reflection mirrors.

\* \* \* \* \*